United States Patent [19]

Kakinuma

[11] Patent Number: 5,053,634

[45] Date of Patent: Oct. 1, 1991

[54] WATERPROOFING DEVICE FOR CONTROL CIRCUIT USED IN OUTBOARD ENGINES

[75] Inventor: Seiichi Kakinuma, Gunma, Japan

[73] Assignee: Sawafuji Electric Co., Ltd., Tokyo, Japan

[21] Appl. No.: 359,709

[22] Filed: May 31, 1989

[30] Foreign Application Priority Data

Jul. 25, 1988 [JP] Japan ............................. 63-98534[U]
Jul. 25, 1988 [JP] Japan ............................. 63-98534[U]

[51] Int. Cl.$^5$ ............................................. H05K 5/06
[52] U.S. Cl. ................................... 307/9.1; 174/52.3;
335/202; 200/302.2; 440/61
[58] Field of Search ............ 200/19 R, 19 DC, 51 R,
200/302.1, 302.2, 308; 174/52.1, 52.3; 335/132,
202; 361/399, 334, 26, 32, 394, 395, 393;
439/709, 712, 715, 718, 76, 34; 440/49, 53, 61;
29/841; 337/91, 112; 137/899.2; 307/9.1, 10.1,
147; 123/195 P, 198 E

[56] References Cited

U.S. PATENT DOCUMENTS 4,554,522 10/1985 Minks .................................. 174/52.3
4,766,272 8/1988 Guzzon .............................. 200/302.2

Primary Examiner—A. D. Pellinen
Assistant Examiner—David Osborn
Attorney, Agent, or Firm—McGlew & Tuttle

[57] ABSTRACT

A waterproofing device for an outboard engine control circuit having a hydraulic pump for lifting and lowering a propeller from and into the water, a motor for driving the hydraulic pump, and a control circuit for controlling the motor, comprising waterproof relays in which terminal strips are provided by insert molding on the casing of a relay for controlling the motor, leads of the relay are inserted into the slots of the terminal strips to electrically connect the leads to the terminal strips, and a waterproof circuit breaker having a waterproof cover provided thereon; a snap-up cap provided on top of the waterproof cover, being normally recessed, and when the circuit breaker is opened, snapped up by the action of the actuator of the breaker.

4 Claims, 11 Drawing Sheets

WATERPROOFING DEVICE FOR CONTROL CIRCUIT USED IN OUTBOARD ENGINES

BACKGROUND OF THE INVENTION

This invention relates to a waterproofing device for an outboard engine control circuit. The control circuit, which is often installed outboard, together with the drive mechanism for lifting and lowering the propeller, is subject to troubles due to the frequent exposure to seawater splashes. Particularly, a waterproofing construction is essential in a circuit breaker designed to forcibly open the circuit to protect from burnout when an excess current flows due to a trouble or a wrong wiring.

DESCRIPTION OF THE PRIOR ART

An outboard engine generally has a hydraulic cylinder to adjust the position of the propeller, and a d-c motor is used to supply the hydraulic cylinder with hydraulic pressure. The position of the outboard engine propeller is kept optimal by operating the hydraulic cylinder by the d-c motor.

A relay assembly as shown in FIGS. 13 through 15 is usually used to change over the direction of revolution of the d-c motor used in the propeller position control device. A pair of relays 62 and 62', disposed in a casing 61, have six terminals 63. Cords 64 are connected to these terminals 63 and the relays 62 and 62' are covered with a cover 65. The input and output cords 64 are drawn outside the casing 61, and an adhesive 67 is poured onto a cord retaining portion 66 constituting a cord outlet, as shown in FIG. 15, to waterproof the cord outlet.

This type of relay assembly, however, involves complex wiring and a large number of components, leading to increased assembly manhours. Though incorporating a waterproofing construction, this type of relay assembly often lacks a perfect seal in a joint between the casing 61 and the cover 65. This poses the problem of making the entire relay assembly 62 watertight, thus leading to a double waterproofing construction.

A relay of a manually resetting type opens a control circuit incorporated in the motor to protect the circuit from burnout when an excess current flows due to trouble caused by seawater infiltrating in the control circuit. Inside the breaker of such a control circuit is there provided a leaf spring made of a bimetal so that electric current is caused to flow in the bimetal. That is, when an excess current flows in the control circuit, the bimetal, heated by the internal resistance thereof, is deformed in such a manner as to separate from the contact, thereby breaking the current. As the bimetal strip is deformed to perform the opening action, the bimetal strip pushes up the resetting actuator to protrude outward from the enclosure so that the open state can be recognized from outside.

The protruded actuator, however, is not only obtrusive but also presents the difficulty in ensuring the watertightness of the portion.

SUMMARY OF THE INVENTION

This invention is intended to solve the aforementioned problems. To achieve this object, the waterproofing device for an outboard engine control circuit of this invention comprises a waterproof relay assembly in which terminal strips are provided by an insert molding on the casing of the relay assembly, leads of the relays are inserted into the slots of the terminal strips to electrically connect the leads to the terminal strips, and a waterproof circuit breaker is provided having a waterproof cover provided thereon; a snap-up cap, provided on top of the waterproof cover, being normally recessed, and when the circuit breaker is opened, snapped up by the action of the actuator of the breaker.

These and other objects and advantages of this invention will become more apparent by referring to the following description and FIGS. 1 through 12.

DETAILED DESCRIPTION OF THE EMBODIMENT

Figure 1A:
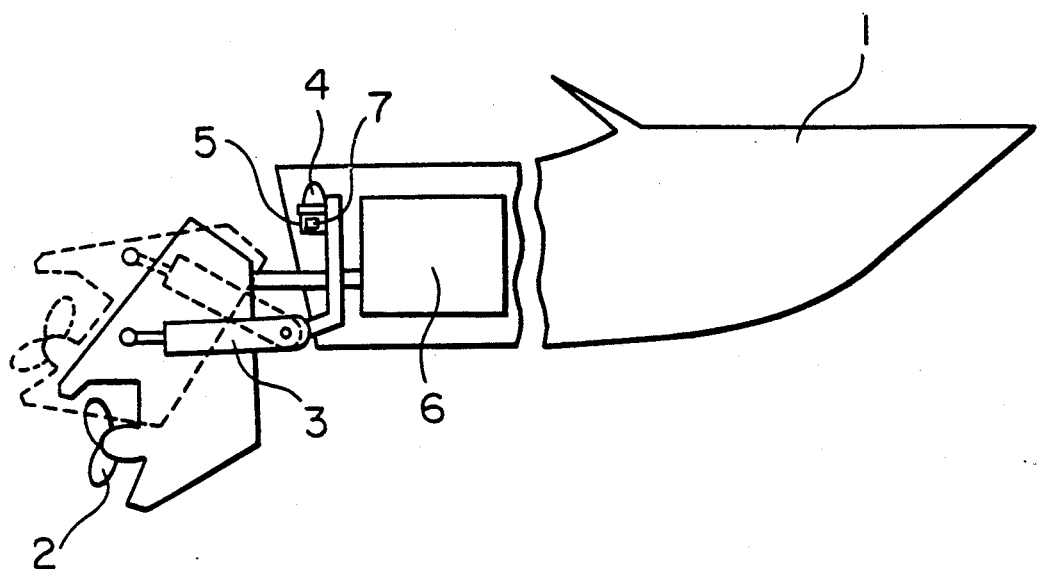
FIGS. 1 (A) and (B) are schematic diagrams of an outboard engine in this invention.
Figure 1B:
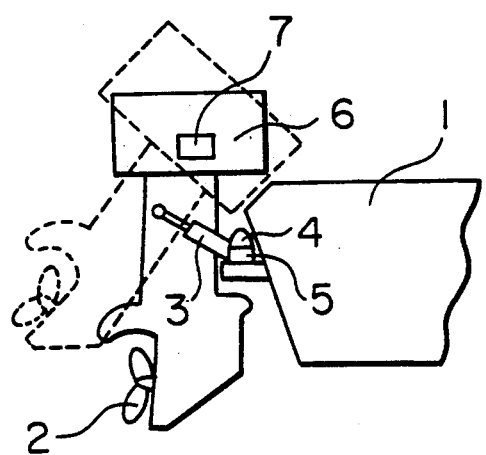

FIGS. 1 (A) and (B) are schematic diagrams of an outboard engine incorporating this invention.

With a small ship 1 shown in FIGS. 1 (A) and (B), a propeller 2 must be lifted and lowered from time to time from and into the water. The lifting and lowering of the propeller 2 is carried out by a hydraulic cylinder 3. Hydraulic pressure to drive the hydraulic cylinder 3 is supplied by a hydraulic pump 4, which is driven by a motor 5.

The propeller 2 is driven directly or indirectly by the engine 6.

Figure 2:
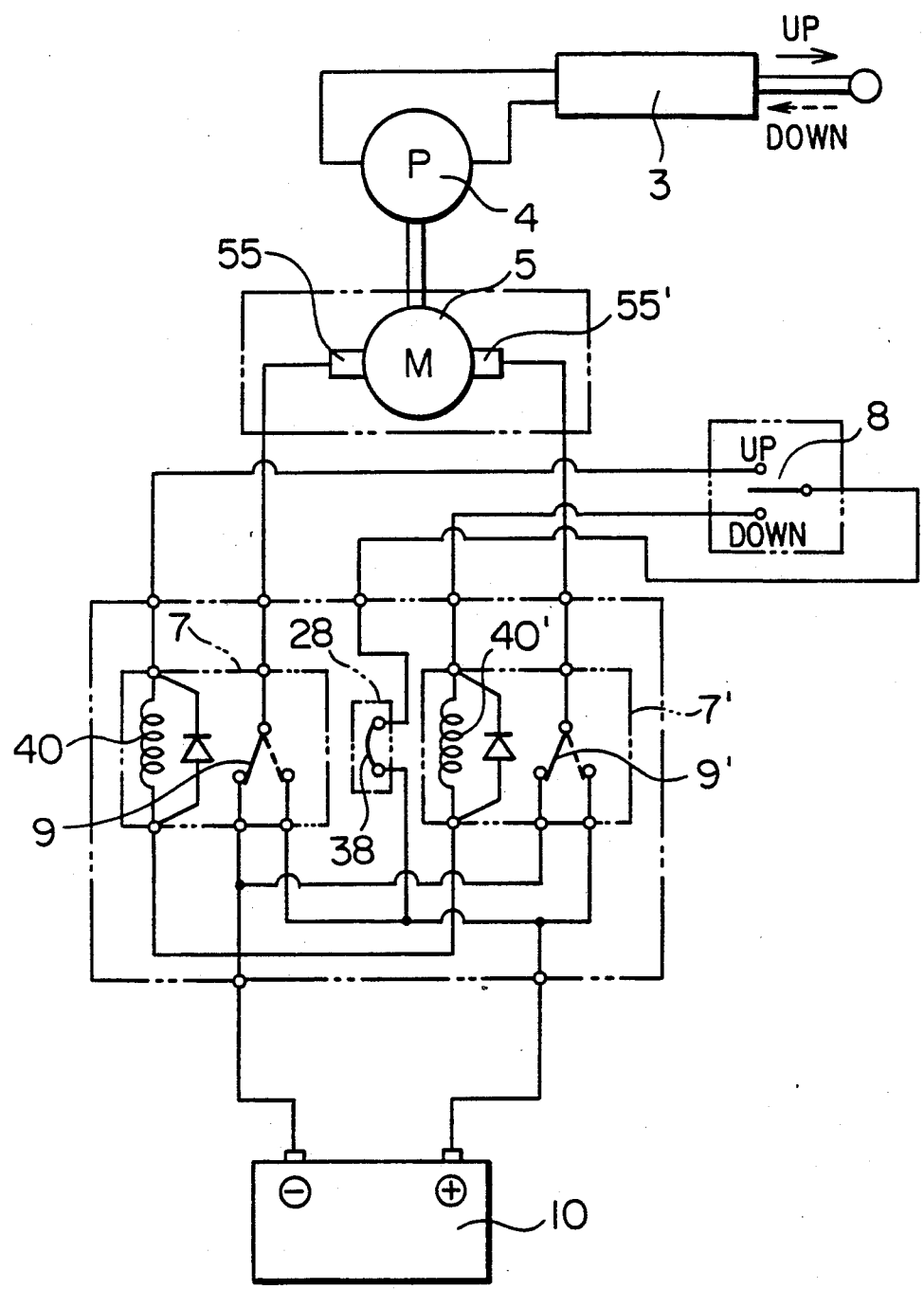
FIG. 2 is a diagram of assistance in explaining a control circuit in this invention.

FIG. 2 show a control circuit to lift and lower the propeller 2.

By changing a switch 8 to the UP side or the DOWN side, for example, either energized side of the relay contacts 9 or 9' of the two relays 7 and 7' is changed over to supply current to the motor 5. As the polarity of a battery 10 is reversed in this way, the hydraulic cylinder 3 is moved to the UP side or the DOWN side by the hydraulic pump 4 driven by the motor 5.

The motor 5 driving the hydraulic pump 4 is apt to be exposed to seawater splashes because the pump 4 is installed outside the ship, as shown in FIGS. 1 (A) and (B). For this reason, the relay and circuit breaker in the control circuit used in an outboard engine must be perfectly waterproofed.

Figure 3:
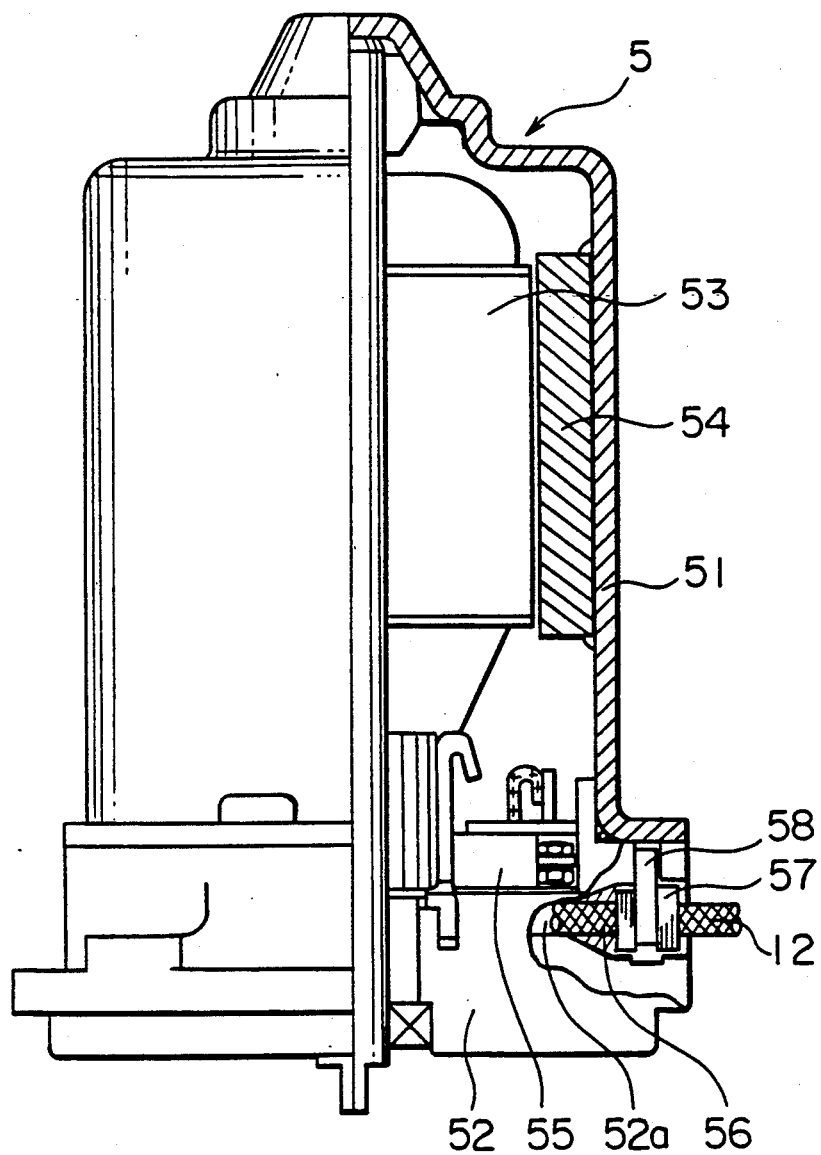
FIG. 3 is a longitudinal section of a motor used in an outboard engine incorporating this invention.

FIG. 3 is a longitudinal section of a motor used in an outboard engine of this invention.

In FIG. 3, a bell-shaped casing 51 of the motor 5 also serves as a yoke; the lower end of a bracket 52 being fixedly fitted to the casing 51 via a waterproof gasket, etc. Inside the casing 51 there are disposed components, such as a rotor 53, a stator 54, and brushes 55, as shown in FIG. 3. A cord outlet portion for drawing a cord 12 outside the motor 5 is provided on a portion of the bracket 52, as shown in the cutaway portion of FIG. 3.

A tapered hole 52a is drilled on the side surface of the bracket 52 toward the center thereof. A grommet 5υ of a truncated-cone shape, having at the center thereof a hole for holding the cord 12 is inserted into the hole 52a.

The cord 12 connected to a brush 55 is drawn out of the motor 5 through the hole 52a. The cord 12 is passed through the grommet 56 and an I-shaped collar 57, and then both the grommet 56 and the I-shaped collar 57 are inserted into the hole 52a. By depressing the end face of the I-shaped collar 57 from the outside toward the inside, the grommet 56 is compressed by the tapered portion of the hole 52a while advancing in the hole 52a. As a result, the cord 12 is compressed, producing a watertight state.

Next, the waterproof relay assembly of this invention will be described, referring to FIGS. 4 through 7.

Figure 4:
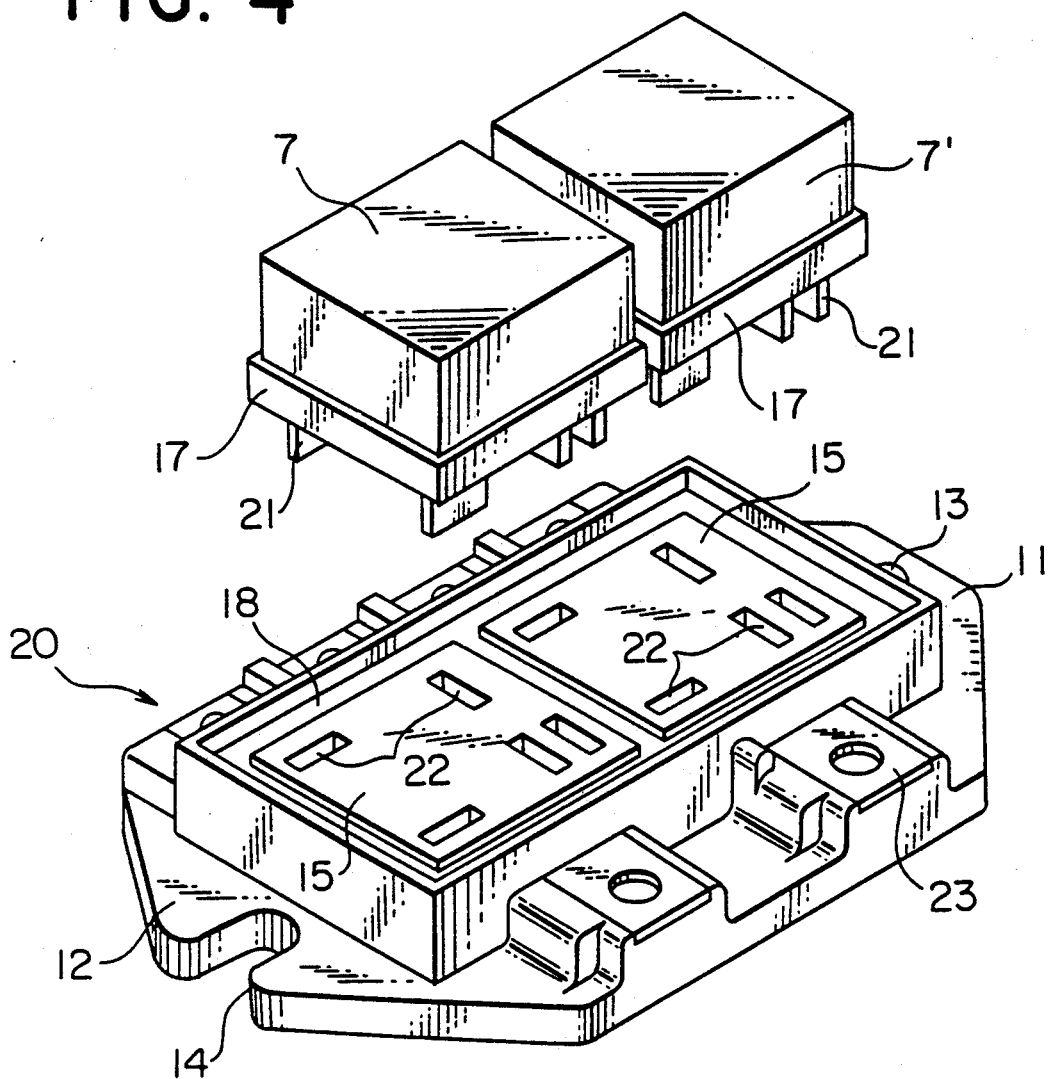
FIG. 4 is an exploded perspective view of a waterproof relay assembly in this invention.
Figure 5:
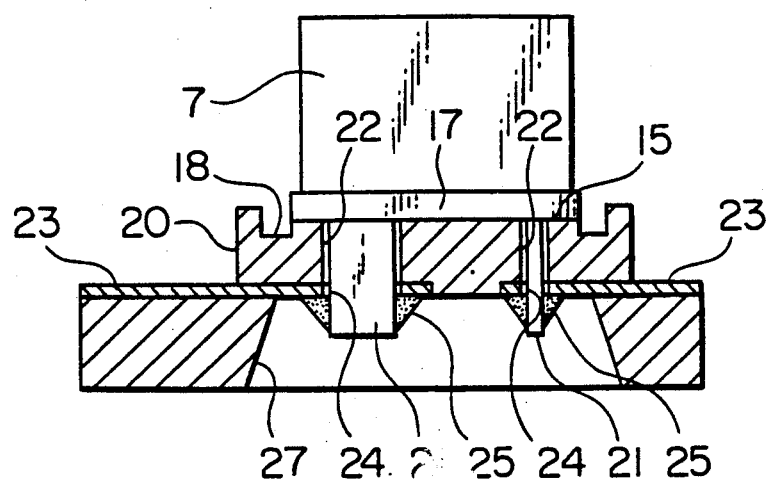
FIG. 5 is a longitudinal section of a waterproof relay assembly in this invention.
Figure 6:
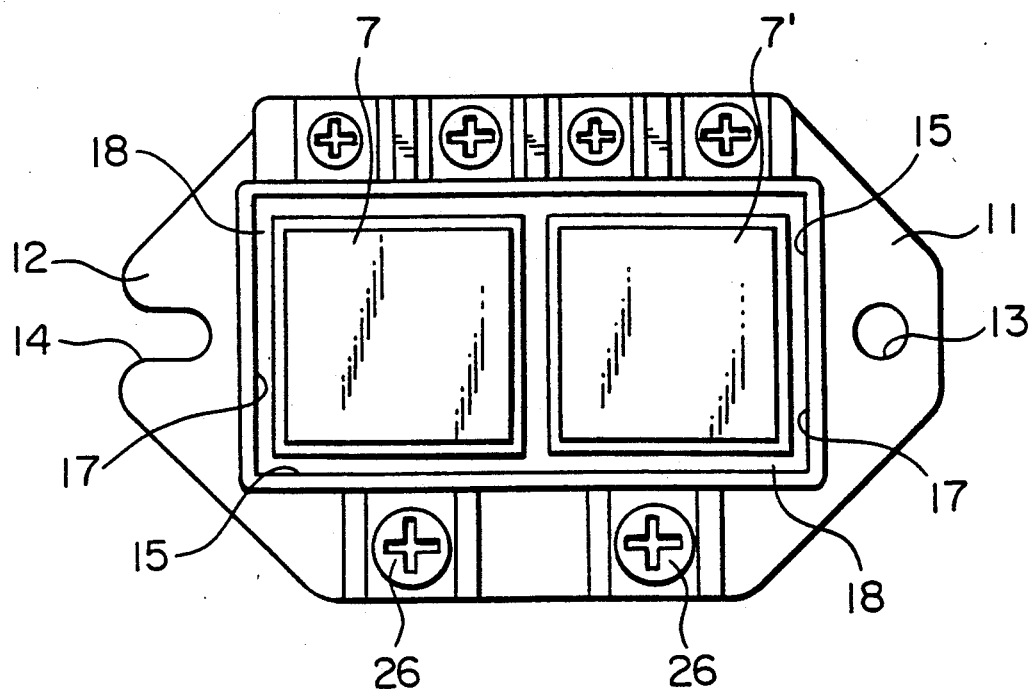
FIG. 6 is plan view of a waterproof relay assembly in this invention.
Figure 7:
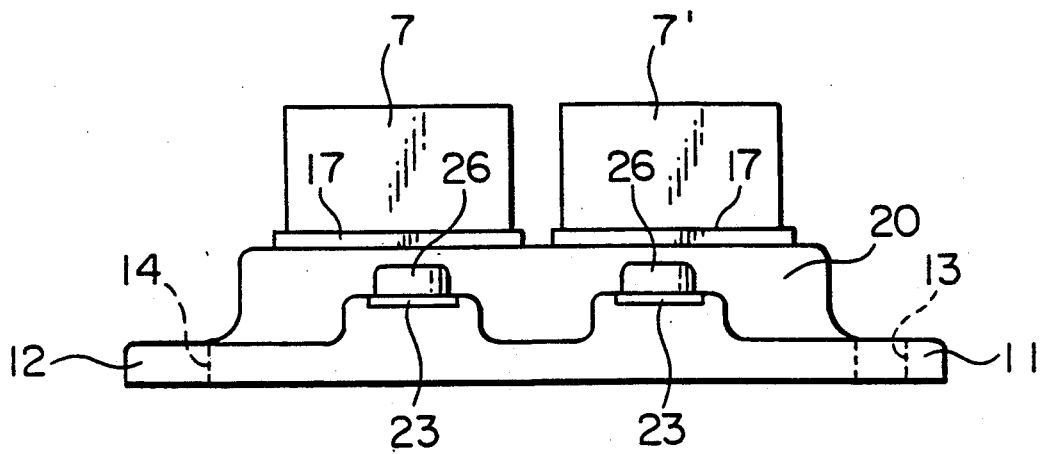
FIG. 7 is a front view of a waterproof relay assembly in this invention.

FIG. 4 is an exploded perspective view of a waterproof relay assembly in this invention. FIG. 5 is a longitudinal section of the waterproof relay assembly in this invention. FIG. 6 is a plan view of the waterproofing device of this invention. FIG. 7 is a front view of the waterproof relay assembly in this invention.

The relay assembly shown in the figures in a device for changing over the direction of revolution of a d-c motor connected directly to the hydraulic pump 4 shown in FIG. 1. The hydraulic pump 4 drives the hydraulic cylinder 3, which in turn controls the position of the propeller 2 of the outboard engine. The relay assembly has a casing 20 made of a synthetic resin molding.

On both sides of the casing 20 provided integrally are mounting pieces 11 and 12, on which either of a round hole 13 or an incision 14 is formed. The casing 20 also has a retaining portion 15 thereon to hold a pair of relays 7 and 7'. The relays 7 and 7' have ribs 17 on the lower periphery thereof, which are engaged with a groove 18 on the retaining portion 15.

As shown in FIG. 2, switching contacts 9 and 9', relay coils 40 and 40' for switching the contacts 9 and 9' are encapsulated inside the relays 7 and 7'. Five leads 21 extend from the bottom of the relays 7 and 7', as shown in FIG. 4. These leads 21 are inserted into insertion holes 22 formed on the retaining portion 15, as shown in FIG. 5. Terminal strips 23 are insert-molded on the casing 20. As shown in FIG. 5, the lead 21 is bonded to the bottom surface of the terminal strip 23 by solder 25. The terminal strip 23 extends to both sides of the casing 20, and is connected to a power cord (not shown) via a screw 26, as shown in FIGS. 6 and 7. A recess 27 in which the leads 21 are soldered to the terminal strips 23 is later filled with a resin to insulate the adjacent combinations of the leads and terminal strips from each other.

The relays 7 and 7' held on the retaining portion 15 are sealed by filling the groove 18 with an adhesive.

As described above, the terminal strip 23 is insert-molded on the casing 20 made of a synthetic resin in the relay assembly for switching over the direction of revolution of the motor 5 shown in FIG. 2.

With the above-mentioned construction of this invention, the lead 21 of the relays 7 and 7' can be electrically connected by soldering to the terminal strip 23 after inserting the lead 21 into the slit 24 of the terminal strip 23. This eliminates the need for internal wiring in the relay assembly. Consequently, the number of components and assembly manhours can be reduced, leading to a reduction in the manufacturing cost of the relay assembly. In addition, this construction makes it possible to make the relay assembly waterproof with a single waterproofing, and a sealed construction can be achieved by assembly.

Now, a waterproof circuit breaker of this invention will be described, referring to FIGS. 8 through 12.

Figure 8:
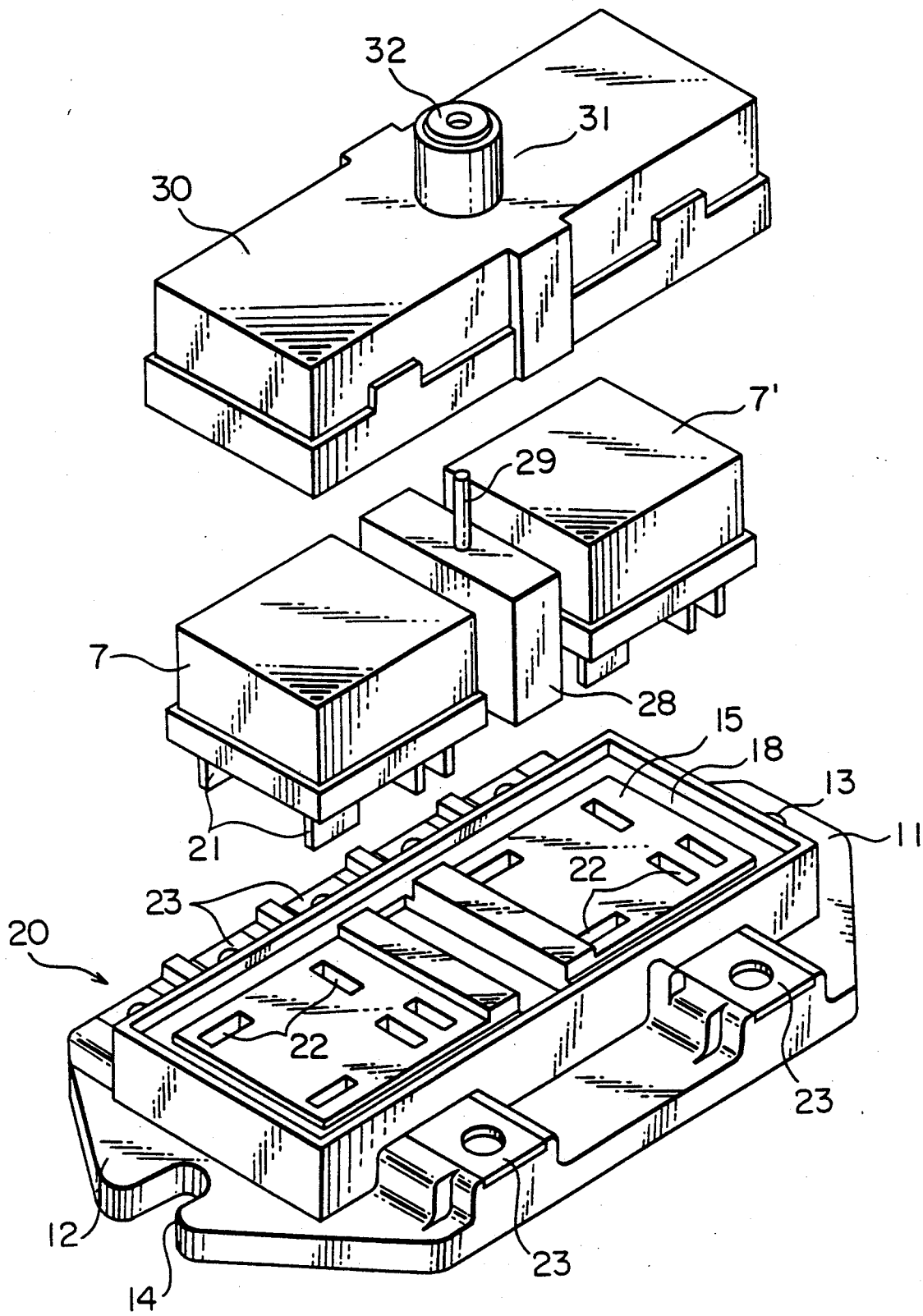
FIG. 8 is an exploded perspective view of a relay assembly incorporating a circuit breaker used in this invention.
Figure 9:
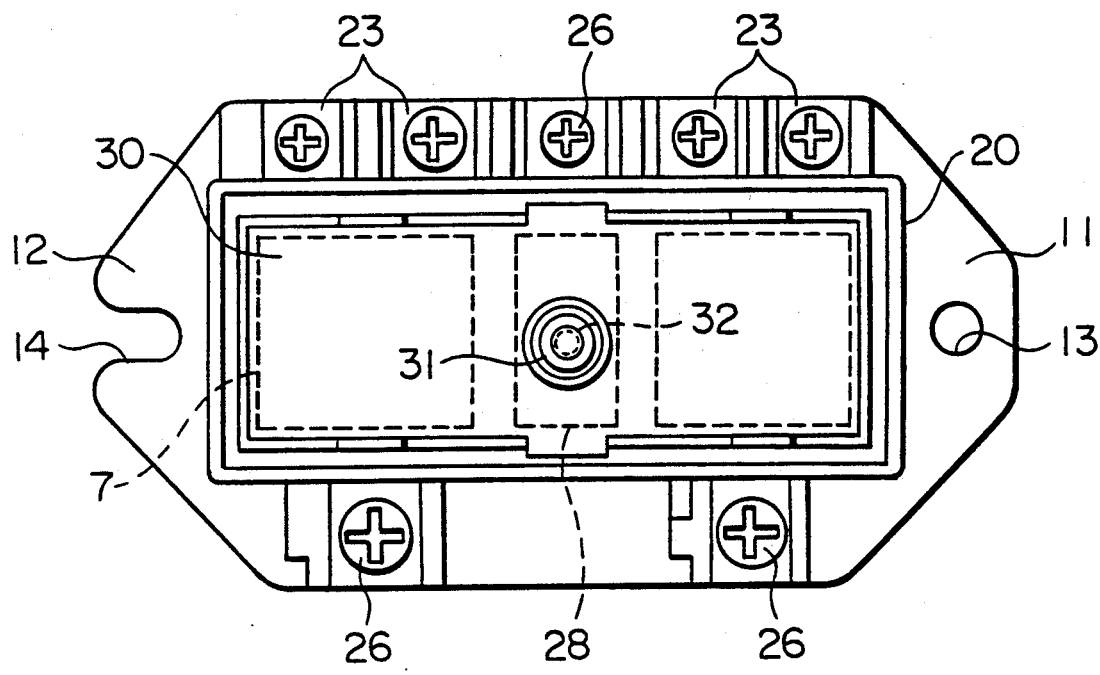
FIG. 9 is a plan view of a relay assembly incorporating a circuit breaker used in this invention.
Figure 10:
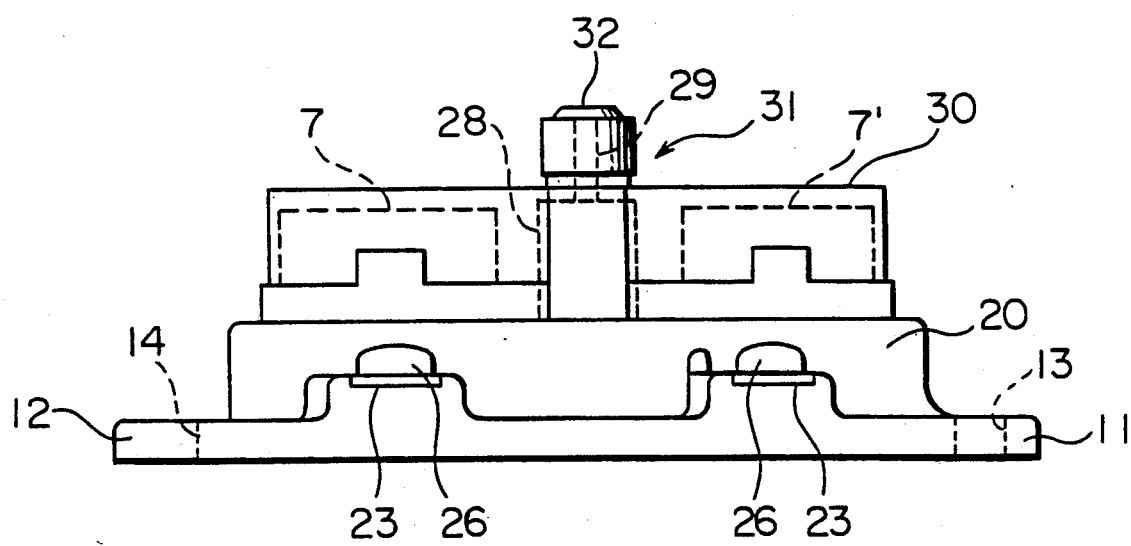
FIG. 10 is a front view of a relay assembly incorporating a circuit breaker used in this invention.
Figure 11A:
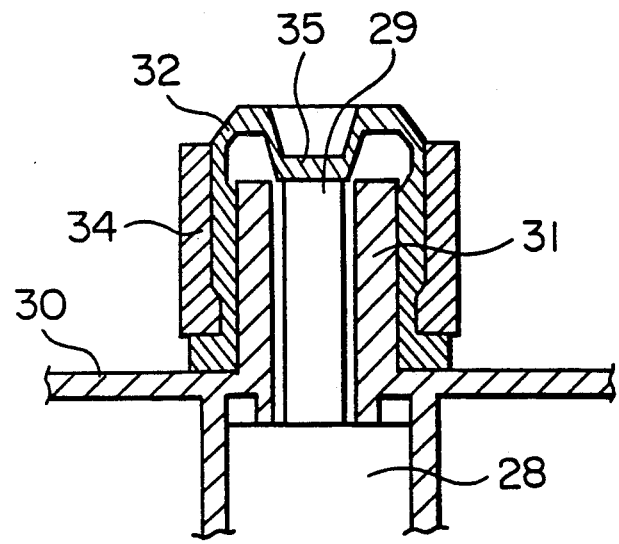
FIGS. 11 (A) and (B) are partially enlarged longitudinal sections of the actuator of a waterproof circuit breaker in this invention.
Figure 11B:
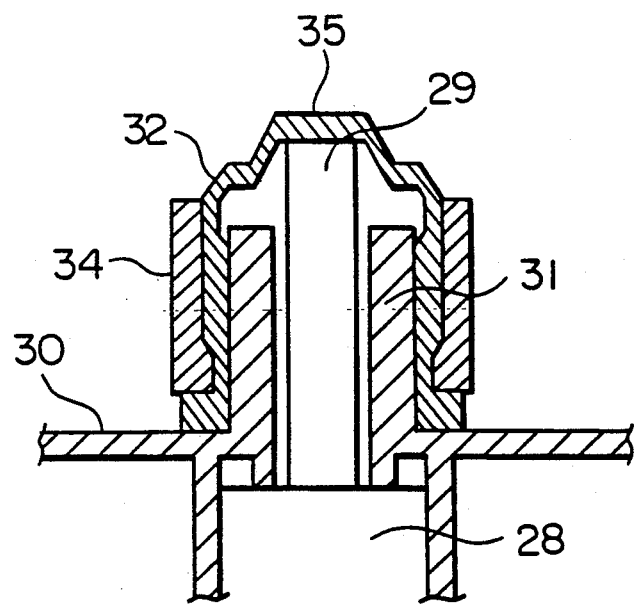
Figure 12A:
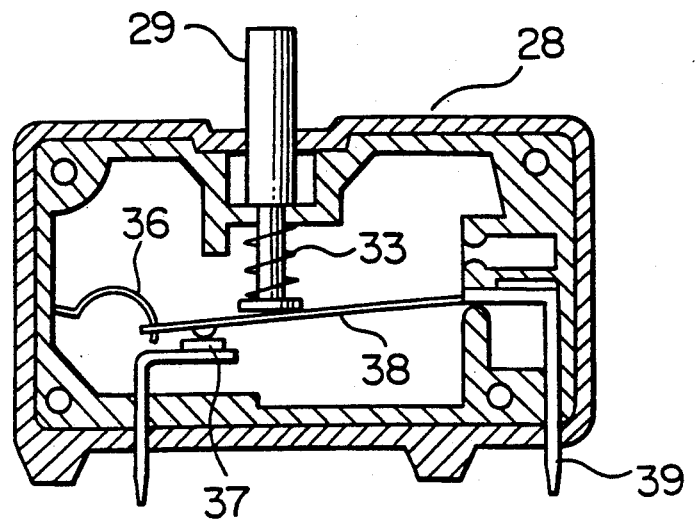
FIGS. 12 (A) and (B) are longitudinal sections of the inside of a waterproof relay assembly of this invention.
Figure 12B:
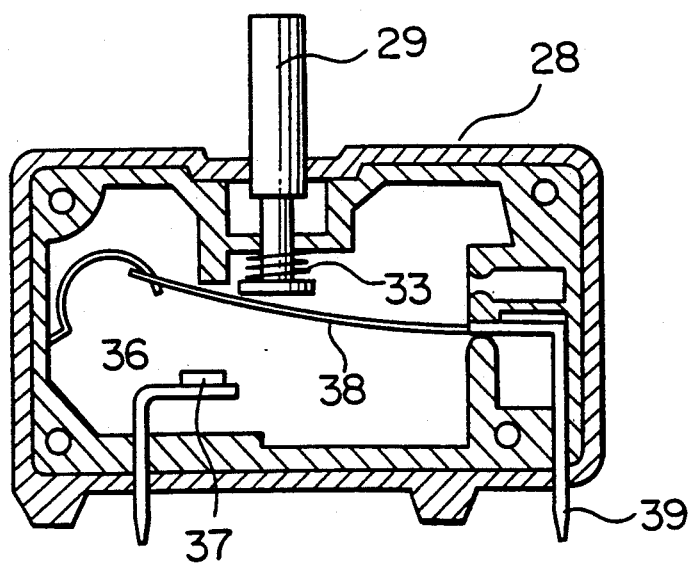
Figure 13:
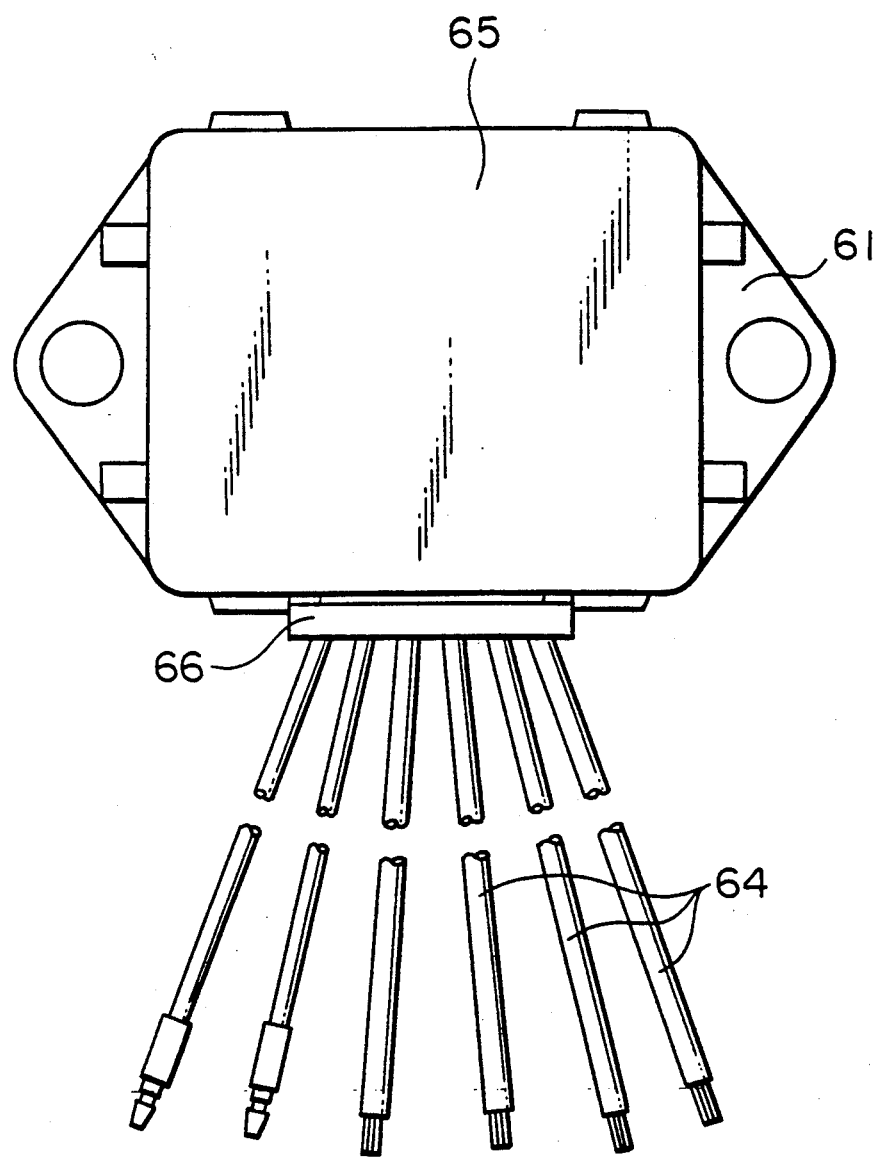
FIG. 13 is a plan view of a waterproof relay assembly in a prior art.
Figure 14:
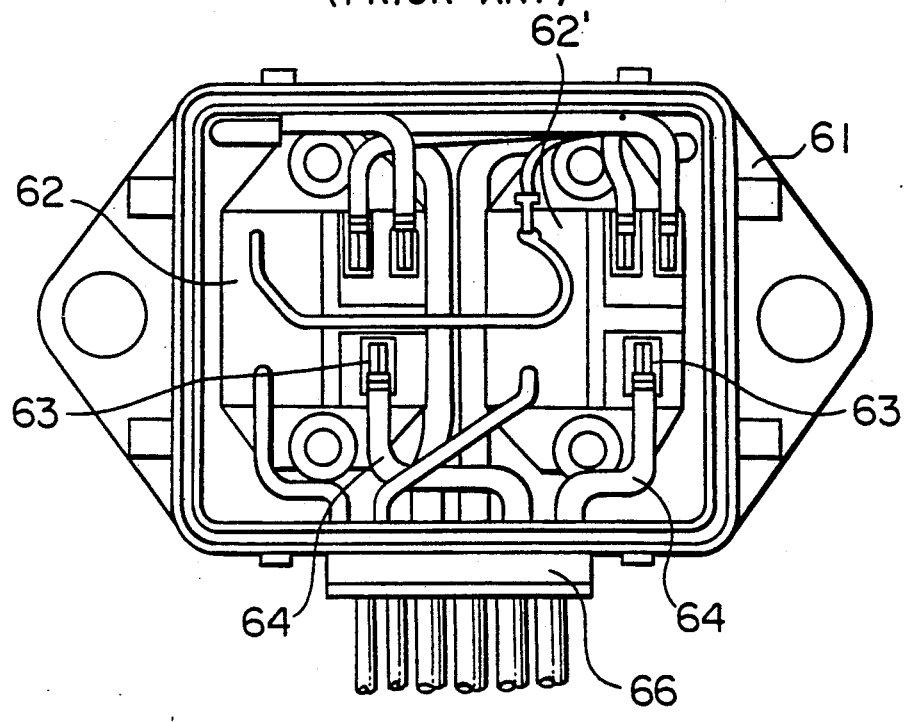
FIG. 14 is a diagram of assistance in explaining the state where the cover of the waterproof relay assembly of the prior art is removed.
Figure 14:
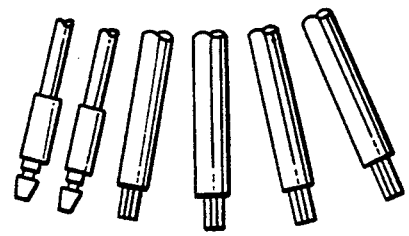
Figure 15:
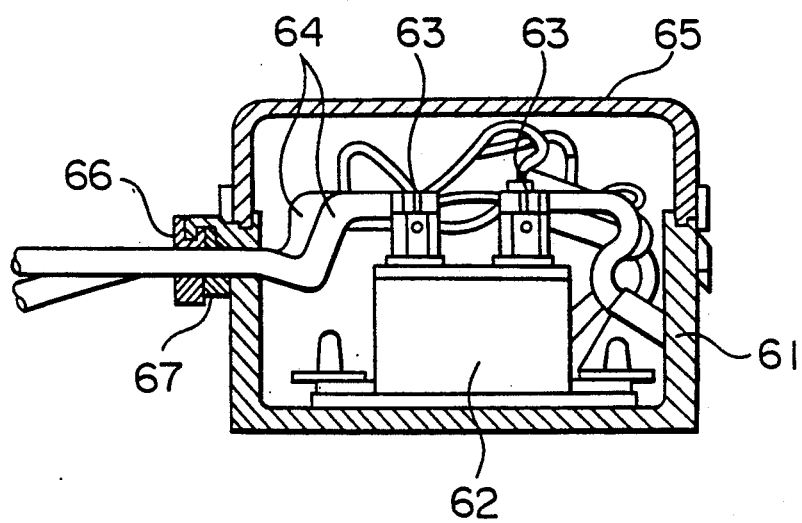
FIG. 15 is a longitudinal view of the relay assembly of the prior art.

FIG. 8 is an exploded perspective view of a relay assembly incorporating a circuit breaker in this invention. FIG. 9 is a plan view of the relay assembly incorporating the circuit breaker in this invention. FIG. 10 is a front view of the relay assembly incorporating the circuit breaker in this invention. FIG. 11 is a partially enlarged longitudinal section of an actuator of the waterproof circuit breaker in this invention. FIG. 12 is a longitudinal section illustrating the inside of the waterproof circuit breaker in this invention.

The circuit breaker 28 is disposed between a pair of the relays 7 and 7', and has an actuator 29 which extends upwards. The actuator 29 is inserted into a protruded portion 31 of a cover 30, which is fitted to the upper part of the casing 20 to cover the relays 7 and 7' and the circuit breaker 28. On the protruded portion 31 provided is a rubber cap 32 forming a waterproof construction.

The circuit breaker 28 has a bimetal strip 38, as shown in FIG. 12 (A), with the base end thereof being connected to a lead 39 and fixedly fitted to the breaker 28, and the free end thereof being connected to a toggle spring 36 and brought in contact with a contact 37. The actuator 29 is forced onto the bimetal strip 38 via a spring 33. The actuator 29 protruding from the upper part of the circuit breaker 28 is inserted in the protruded portion 31 of the cover 30, as shown in FIG. 11 (A). As noted earlier, the protruded portion 31 has the rubber cap 32, the top of which is formed into a snap-up cap 35. The snap-up cap 35 is pushed by the actuator upwards to snap up, as shown in FIG. 11 (B), when the breaker 28 performs a circuit breaking operation.

Next, the circuit of the relay assembly incorporating the circuit breaker 28 will be described, referring to FIG. 2.

As shown in FIG. 2, the contacts 9 and 9' of the relays 7 and 7' are caused to make and break by the relay coils 40 and 40', and connected across the motor 5 and the battery 10. The relay coils 40 and 40' are connected to the battery 10 via a switch 8. The circuit breaker 28 is connected across the switch 8 and the battery 10 to open the circuit when an excess current flows in the relay coils 40 and 40'.

With the above-mentioned construction, when the switch 8 is switched to the UP side, the relay coil 40 is excited, switching the contact to a position shown by a dotted line.

Consequently, the left-hand brush 55 of the motor 5 shown in FIG. 2 is connected to the positive terminal of the battery 10, while the right-hand brush 55' of the motor 5 is connected to the negative terminal of the battery 10 via the contact 9' which has been thrown to a position shown by a solid line.

As a result, the motor 5 revolves in the normal direction.

When the switch 8 is turned to the DOWN side, the relay coil 40' is excited to change the contact 9' to a position shown by a dotted line.

Consequently, the right-hand brush 55' of the motor 5 is connected to the positive terminal of the battery 10, while the left-hand brush 55 is connected to the negative terminal of the battery 10 via the contact 9 which has been thrown to a position shown by a solid line. Thus, the motor 5 revolves in the reverse direction.

The motor 5 is connected directly to the hydraulic pump 4, which is in turn connected to the hydraulic cylinder 3 for controlling the position of the propeller 2 of the outboard engine. By switching the switch 8, therefore, the position of the propeller 2 can be controlled by means of the motor 5, the hydraulic pump 4, and the hydraulic cylinder 3.

As shown in FIG. 2, the circuit breaker 28 having the bimetal strip 38 as a movable contact between the switch 8 and the battery 10. If an excess current flows in the relay coils 40 and 40' for some reason or other, the bimetal strip 38 is heated by the internal resistance thereof, as shown in FIG. 12 (A), and deformed beyond the dead point, bent upward in an arch shape, as shown in FIG. 12 (B). At this time, the toggle spring 36 is snapped to the reversed state, thus stably holding the bimetal strip 38 in an open, or break state. Consequently, the actuator 29 is pushed by the bimetal strip 38, and moved upwards resisting the spring 33. The state of the actuator 29 at this time is changed from the normal state shown in FIG. 12 (A) to the open, or break state shown in FIG. 12 (B).

The actuator 29 pushes up the snap-up cap 35 provided on the rubber cap 32, causing the cap 35 to snap up. Thus, the state of the circuit breaker 28 can be recognized from outside by the shape of the snap-up cap 35. The actuator 29 can be returned from the state shown in FIG. 12 (B) to the original position shown in FIG. 12 (A) by pushing the snap-up cap 35 downward.

The actuator 29 of the circuit breaker incorporated in the relay assembly according to this invention is formed into a long piece, inserted into the cylindrical protruded portion 31 formed on the cover 30, and made waterproof by using the rubber cap 32. The shape of the snap-up cap 35 on top of the rubber cap 32, which is pushed up by the actuator 29, tells the state of the circuit breaker 28 from outside. By incorporating the circuit breaker 28 of this type into a relay assembly, the relay coils 40 and 40' and the harness can be prevented from being burned out. In addition, the provision of the circuit breaker 28 can eliminate the need for fuses and spare fuses as well. After the trouble is fixed, the outboard engine can be easily restarted by resetting the actuator 29 by pushing down the snap-up cap 35.

What is claimed is:

1. A waterproofing arrangement for a control circuit used in outboard engines with a hydraulic pump for lifting a propeller from the water and lowering a propeller into the water, a motor for driving the hydraulic pump, said control circuit for controlling the said motor, comprising: control circuit elements including a relay for controlling the direction of revolution of said motor; a cover for covering of said relay, said relay including a plurality of leads extending from a bottom of said relay and ribs on a lower periphery of said relay; a molded casing including terminal strips, insert-molded thereon, said casing including a recess provided under said terminal strips, communicating with said terminal strips, said casing including a retaining portion provided on said terminal strips and limited by a groove extending around said retaining portion, insertion holes being formed in said retaining portion extending through said casing and said terminal strips to said recess, said leads of said relay extending from a bottom side of said relay and extending into said insertion holes through said casing and said terminal strips and being bonded to said terminal strips by solder, ribs of said relay engaging said groove to position said relay and said leads relative to said insertion holes and said casing, said recess being filled with a resin to insulate each of said leads and associated terminal strips from each other, said ribs being sealed to said casing by fitting said casing with adhesive and said cover being connected to said casing covering said relay and fixed to said casing by said adhesive and said groove.

2. A waterproof arrangement for a control circuit used in outboard engines according to claim 1 wherein said waterproofing arrangement includes a circuit breaker arrangement for protecting said control circuit of said motor, said cover including a snap-up cap provided on a top surface of said cover, said snap-up cap including an element normally defining a recess, said circuit breaker including an actuator which moves upwardly upon a break of the control circuit casing said snap-up cap to move from said recess position to an upwardly extending position.

3. A waterproof arrangement for circuit elements of a control circuit used in outboard engines, comprising: a casing molded with elements inserted therein, said elements including at least a first terminal strip extending out of said casing and a second terminal strip extending out of said casing, said terminal strips being spaced apart, said casing including an underside with a recess defined therein, said recess extending to an underside of said first terminal strip and second terminal strip, said casing including an upper side with a retaining portion and a groove extending around said retaining portion, said casing including insertion holes formed extending through said retaining portion to said cavity; a relay including a plurality of leads extending from a bottom side of said relay and ribs extending about a lower periphery of said relay, said leads extending through said insertion holes and said relay ribs engaging said groove, said lead extending into said cavity and being bonded to said terminal strips by solder, said recess being filled with resin to insulate each of said leads and terminal strips from each other; and, a cover for sealing said relay, said groove being filled with adhesive and said cover being positioned surrounding said ribs and being maintained with said ribs fixed in said groove.

4. An arrangement according to claim 3, further comprising a mounting piece including a flange element extending from said casing for sealing the mounting said casing to the motor.

* * * * *